US008795549B2

(12) United States Patent
Stockum et al.

(10) Patent No.: US 8,795,549 B2
(45) Date of Patent: Aug. 5, 2014

(54) PRINTABLE MEDIUM FOR ETCHING OXIDIC, TRANSPARENT AND CONDUCTIVE LAYERS

(75) Inventors: Werner Stockum, Reinheim (DE); Armin Kuebelbeck, Bensheim (DE)

(73) Assignee: Merck Patent GmbH, Darmstadt (DE)

( * ) Notice: Subject to any disclaimer, the term of this patent is extended or adjusted under 35 U.S.C. 154(b) by 1001 days.

(21) Appl. No.: 12/447,763

(22) PCT Filed: Oct. 5, 2007

(86) PCT No.: PCT/EP2007/008663
§ 371 (c)(1),
(2), (4) Date: Apr. 29, 2009

(87) PCT Pub. No.: WO2008/052637
PCT Pub. Date: May 8, 2008

(65) Prior Publication Data
US 2010/0068890 A1 Mar. 18, 2010

(30) Foreign Application Priority Data

Oct. 30, 2006 (DE) .................. 10 2006 051 735

(51) Int. Cl.
*C09K 13/06* (2006.01)
*C09K 13/00* (2006.01)
*H01B 13/00* (2006.01)
(52) U.S. Cl.
USPC .......................... 252/79.4; 252/79.1; 216/13
(58) Field of Classification Search
None
See application file for complete search history.

(56) References Cited

U.S. PATENT DOCUMENTS

| 3,904,443 | A | | 9/1975 | Sullivan et al. |
| 4,731,705 | A | * | 3/1988 | Velasco et al. ................ 361/502 |
| 5,457,057 | A | * | 10/1995 | Nath et al. ...................... 438/67 |
| 5,688,366 | A | | 11/1997 | Ichinose et al. |
| 2004/0242019 | A1 | | 12/2004 | Klein et al. |
| 2005/0037262 | A1 | * | 2/2005 | Vallee et al. ................... 429/217 |
| 2005/0236275 | A1 | * | 10/2005 | Phipps ........................ 205/118 |
| 2005/0247674 | A1 | * | 11/2005 | Kubelbeck et al. ............ 216/92 |
| 2006/0061267 | A1 | * | 3/2006 | Yamasaki et al. ............. 313/504 |
| 2006/0118759 | A1 | * | 6/2006 | Klein et al. ................... 252/79.1 |
| 2007/0212606 | A1 | * | 9/2007 | Chang .......................... 429/221 |
| 2007/0241482 | A1 | * | 10/2007 | Giller et al. ................... 264/494 |
| 2007/0281216 | A1 | * | 12/2007 | Petrat et al. ................... 429/324 |
| 2008/0056978 | A1 | * | 3/2008 | Chang et al. ................... 423/306 |
| 2009/0035661 | A1 | * | 2/2009 | Swoyer et al. ............. 429/231.5 |

FOREIGN PATENT DOCUMENTS

| WO | WO 01/83391 A1 | 11/2001 |
| WO | WO 2005096414 A2 * | 10/2005 |
| WO | WO 2006/074791 A1 | 7/2006 |
| WO | WO 2007/009546 A1 | 1/2007 |

OTHER PUBLICATIONS

A. Goetzberger et al., Sonnenergie : Photovoltaik, Teubner Studienbücher Stuttgart 1997, pp. 40 ; 107.
M. Köhler, "Atzverfahren Für Die Mikrotechnik", Wiley VCH 1983.

(Continued)

*Primary Examiner* — Shamim Ahmed
*Assistant Examiner* — Bradford Gates
(74) *Attorney, Agent, or Firm* — Millen, White, Zelano, Branigan, P.C.

(57) ABSTRACT

The present invention relates to novel printable etching media having improved properties for use in the process for the production of solar cells. These are corresponding particle-containing compositions by means of which extremely fine lines and structures can be etched very selectively without damaging or attacking adjacent areas.

19 Claims, 2 Drawing Sheets

(56) References Cited

OTHER PUBLICATIONS

Broschure, "Dynamic Light Scattering: An Introduction in 30 Minutes", DLS Technical Note, MRK656-01 von Malvern Instruments Ltd.
ISO 13321, Methods for Determination of Particle Size Distribution of Paticle Size Distribution Part 8: Photon Correlation Spectroscopy, International Organisation for Standardisation [(ISO) 1996 (First Edition Jul. 1, 1996)].

J. Buhler et al., "Silicon Dioxide Sacrificial Layer Etching in Surface Micromachining", J. Micromech. Microeng., vol. 7 (1997) pp. R1-R13.
D. Monk et al., "A Review of the Chemical Reaction Mechanism and Kinetics for Hydrofluoric Acid Etching of Silicon Dioxide for Surface Micromachining Applications", Thin Solid Films, vol. 232 (1993) pp. 1-12.

* cited by examiner

PRINTABLE MEDIUM FOR ETCHING OXIDIC, TRANSPARENT AND CONDUCTIVE LAYERS

The present invention relates to novel printable etching media having improved properties for use in the process for the production of solar cells. These are corresponding particle-containing compositions by means of which extremely fine lines and structures can be etched very selectively without damaging or attacking adjacent areas.

PRIOR ART AND OBJECT OF THE INVENTION

During the process for the production of solar cells, it is necessary, inter alia, to structure oxide layers on a support material. A crystalline silicon solar cell usually consists of a p-conducting substrate into which a layer of an n-conducting substance, for example phosphorus, of homogeneous thickness is diffused on the front. In order to conduct away the current generated during incidence of light, metallically conducting contacts are applied to the front and back of the wafer. For the purposes of an inexpensive production method which is suitable for mass production, the contacts are usually produced by means of screen printing.

Besides the oxide layers which have to be structured during the production of solar cells, silicon nitride layers also have to be etched. For the etching of corresponding nitride layers, the methods used have to be modified and the etching pastes adapted in a suitable manner.

The surfaces of crystalline silicon solar cells are coated with thin inorganic layers during the production process, and if desired also when it is complete. These layers have thicknesses in the range from 20 to 200 nm, in most cases in the range from 50 to 150 nm.

In the course of the process for the production of crystalline silicon solar cells, it is therefore advantageous to etch fine lines into these inorganic layers of the solar cell in a number of process steps.

These openings in the surface of the solar cell can be used, for example, for the generation of a so-called selective emitter, also known as two-stage emitter. To this end, high n-doping is produced in a subsequent diffusion step in the partial openings of a diffusion barrier located on the silicon, preferably by means of phosphorus diffusing in.

In the present description, inorganic surfaces are taken to mean oxidic and nitride-containing compounds of silicon, in particular silicon oxide and silicon nitride surfaces. The way in which diffusion barriers of this type work is known to the person skilled in the art and is described in the literature [A. Goetzberger; B. Voβ; J. Knobloch, Sonnenenergie: Photovoltaik [Solar Energy: Photovoltaics], Teubner Studienbücher Stuttgart 1997, pp 40, 107]. These diffusion barriers can be produced here in a variety of ways:

Very dense silicon dioxide layers are obtained, for example, by heat treatment of silicon in an oxygen-containing atmosphere at temperatures in the region of 900° C. (thermal oxide).

Likewise known to the person skilled in the art is the deposition of silicon dioxide by the CVD process. Depending on the way in which the reaction is carried out, a distinction is made, inter alia, between the following processes APCVD (atmospheric pressure CVD)
PE-CVD (plasma enhanced CVD)
LP-CVD (low pressure CVD)

A common feature of these processes is that the desired inorganic compound is obtained from the gas phase of a volatile precursor, in the example silicon dioxide this is, for example, silane ($SiH_4$) or TEOS (tetraethyl orthosilicate), by deposition of the precursor on the target substrate with decomposition.

Silicon dioxide layers which represent a diffusion barrier can also be obtained by means of wet-chemical coating with a liquid or dissolved solid precursor in a solvent or solvent mixture. These liquid systems are usually applied by spin coating to the substrate to be coated. These systems are known to the person skilled in the art as spin-on-glass (SOG).

In many cases, the applied $SiO_2$ layer also remains as reflection-reducing passivation layer. This is frequently the case, in particular, in the case of thermally grown $SiO_2$.

Apart from silicon oxide layers, transparent conductive layers (TCOs) play an important role (for example LC displays, touch panels, etc.). Besides ZnO compounds with binary or ternary doping (such as, for example, indium-zinc oxide, Al—ZnO, antimony-ZnO), the indium-tin oxide layers in particular are widespread. Indium-tin oxides are mixed oxides consisting of indium oxide ($In_2O_3$) and tin(IV) oxide ($SnO_2$) (but can also be used with other dopants, such as, for example, fluorine as $Fl:SnO_2$). These TCO layers are referred to below by way of example as ITO. These transparent semiconductors have the property of being electrically conductive and transparent. In the electronics industry, they are employed for the production of thin-film solar cells, transparent electrodes in liquid-crystal screens, organic light-emitting diodes and touch screens. As a semiconductor which strongly reflects infrared radiation, ITO is applied in a scattered manner or over a large area as thermal protection to sheets of window glass. A very wide variety of surfaces, for example plastic films, can likewise be coated with ITO in order that they do not become electrostatically charged.

ITO usually consists of 90% of indium oxide ($In_2O_3$) and 10% of tin (IV) oxide ($SnO_2$). The tin(IV) oxide, as dopant, produces the flaws necessary for good electrical conductivity in the crystal structure of the indium oxide. Thin layers of typically about 200 nm have high transparency and have a surface resistance of about 6 ohm/$cm^2$.

ITO is usually applied to the corresponding substrates—almost always glasses—by cathode sputtering. However, ITO can also be applied by high-vacuum vapour deposition, although the components coated by vapour deposition have to be warmed to up to 360° C., which restricts the applicability.

Silicon nitride layers are used less as diffusion barriers in the technology of crystalline solar cells, although they are in principle likewise suitable for this purpose. Silicon nitride layers are essentially used as passivation and antireflection layer.

In the production of crystalline silicon solar cells, it is advantageous also to be able to produce openings in a targeted manner in silicon nitride layers. An example which may be mentioned here is the application of electrically conductive pastes. These metal pastes are usually "fired" through the silicon nitride layer at temperatures of about 600° C., enabling electrical contact to the emitter layer. Due to the high temperatures, polymer-based (epoxy or phenolic resin) metallisation pastes therefore cannot be used for this purpose. Crystal defects and metallic contamination in the underlying silicon also arise during performance of the fire-through process. As a consequence of the system, the passivation layer is in addition totally destroyed by the printed-on metal paste on top. It would therefore be more advantageous to produce a partial, narrower opening in the silicon nitride layer for electrical contacting and to retain the passivation layer in the edge regions, which are masked by the metallisation layer on top.

Besides pure diffusion barriers consisting of silicon dioxide or silicon nitride, it is also possible to use thin glass layers in the production of crystalline silicon solar cells.

Definition of Glass:

Glass is taken to mean per se a uniform composition, for example quartz, window glass, borosilicate glass, but also thin layers of these materials produced on other substrates (for example ceramics, metal sheets, silicon wafers) by various methods known to the person skilled in the art (CVD, PVD, spin-on, thermal oxidation, inter alia).

Glasses below are taken to mean silicon oxide- and silicon nitride-containing materials which are in the solid amorphous physical state without the glass components crystallising out and have a high degree of disorder in the microstructure owing to the lack of long-range order.

Besides pure $SiO_2$ glass (quartz), these encompass all glasses (for example doped glasses, such as borosilicate, phosphosilicate and borophosphosilicate glasses, coloured glasses, milk glasses, crystal glasses, optical glasses) which contain $SiO_2$ and other components, in particular elements such as, for example, calcium, sodium, aluminium, lead, lithium, magnesium, barium, potassium, boron, beryllium, phosphorus, gallium, arsenic, antimony, lanthanum, zinc, thorium, copper, chromium, manganese, iron, cobalt, nickel, molybdenum, vanadium, titanium, gold, platinum, palladium, silver, cerium, caesium, niobium, tantalum, zirconium, neodymium, praseodymium, which occur in the glasses in the form of oxides, carbonates, nitrates, phosphates, sulfates and/or halides or function as doping elements in the glasses. Doped glasses are, for example, borosilicate, phosphosilicate and borophosphosilicate glasses, coloured glasses, milk glasses, crystal glasses and optical glasses. The silicon nitride may likewise comprise other elements, such as boron, aluminium, gallium, indium, phosphorus, arsenic or antimony.

Definition of Silicon Oxide- and Silicon Nitride-Based Systems:

Silicon oxide-based systems are defined below as all crystalline systems which do not fall under the definition of amorphous $SiO_2$ glasses given above and are based on silicon dioxide; these can be, in particular, the salts and esters of orthosilicic acid and condensation products thereof—generally referred to as silicates by the person skilled in the art—as well as quartz and glass-ceramics.

Furthermore, other silicon oxide- and silicon nitride-based systems, in particular the salts and esters of orthosilicic acid and condensation products thereof, are also encompassed. Besides pure $SiO_2$ (quartz, tridymite, cristobalite), all $SiO_2$-based systems built up from $SiO_2$ or "discrete" and/or linked [$SiO_4$] tetrahedra, such as, for example, mesosilicates, sorosilicates, cyclosilicates, inosilicates, phyllosilicates, tectosilicates, and comprising other components, in particular elements/lcomponents such as, for example, calcium, sodium, aluminium, lithium, magnesium, barium, potassium, beryllium, scandium, manganese, iron, titanium, zirconium, zinc, cerium, yttrium, oxygen, hydroxyl groups, halides, are also encompassed.

Silicon nitride-based systems are defined below as all crystalline and partially crystalline (usually referred to as microcrystalline) systems which do not fall under the definition of amorphous silicon nitride glasses/layers given above. These include $Si_3N_4$ in its modifications as $\alpha$-$Si_3N_4$ and $\beta$-$Si_3N_4$ and all crystalline and partially crystalline $SiN_x$ and $SiN_x$:H layers. Crystalline silicon nitride may comprise other elements, such as boron, aluminium, gallium, indium, phosphorus, arsenic and antimony.

Etching of Structures

The use of etchants, i.e. chemically aggressive compounds, results in the dissolution of the material exposed to the etchant attack. In most cases, the aim is completely to remove the layer to be etched. The end of the etching is reached by the encountering of a layer which is substantially resistant to the etchant. In addition, there is the process known to the person skilled in the art of partial removal of a layer by etching to a target thickness which is usually defined.

Etching of structures on silicon oxide- and silicon nitride-based glasses and other silicon oxide- and silicon nitride-based systems:

According to the current state of the art, any desired structures can be etched selectively in silicon oxide- and silicon nitride-based glasses and other silicon oxide- and silicon nitride-based systems or surfaces thereof and layers thereof of variable thickness directly by laser-supported etching methods or, after masking, by wet-chemical methods ([1] D. J. Monk, D. S. Soane, R. T. Howe, Thin Solid Films 232 (1993), 1; [2] J. Bühler, F.-P. Steiner, H. Baltes, J. Micromech. Microeng. 7 (1997), R1) or by dry-etching methods ([3] M. Köhler "Ätzverfahren für die Mikrotechnik" [Etching Methods for Microtechnology], Wiley VCH 1983).

In the laser-supported etching methods, the laser beam scans the entire etching pattern on the glass dot by dot or line by line in the case of vector-orienting systems, which, besides a high degree of precision, also requires considerable adjustment effort and time.

The wet-chemical and dry-etching methods include material-intensive, time-consuming and expensive process steps:

A. Masking of the Areas not to be Etched, for Example by:
photolithography: Production of a negative or positive of the etching structure (depending on the resist), coating of the substrate surface (for example by spin-coating with a liquid photoresist), drying of the photoresist, exposure of the coated substrate surface, development, rinsing, optionally drying B. Etching of the Structures by:
dip methods (for example wet etching in wet-chemistry benches): dipping of the substrates into the etching bath, etching operation, repeated rinsing in $H_2O$ cascade sinks, drying spin-on or spray methods: the etching solution is applied to a rotating substrate, the etching operation can be carried out without or with input of energy (for example IR or UV irradiation), this is followed by rinsing and drying dry-etching methods, such as, for example, plasma etching, in expensive vacuum units or etching with reactive gases in flow reactors C. Removal of the Photoresist:
In a final process step, the photoresist covering the protecting areas of the substrate must be removed. This can be carried out by means of solvents, such as, for example, acetone, or dilute aqueous alkaline solutions. The substrates are finally rinsed and dried.

Full-area etching of silicon oxide- and silicon nitride-based glasses and other silicon oxide- and silicon nitride-based systems:

In order to etch silicon oxide- and silicon nitride-based glasses and other silicon oxide- and silicon nitride-based systems and layers of variable thickness thereof over the entire area completely or only to a certain depth, use is predominantly made of wet-etching methods. The silicon oxide- and silicon nitride-based glasses and other silicon oxide- and silicon nitride-based systems and layers of variable thickness thereof are dipped into etching baths, which usually contain the toxic and highly caustic hydrofluoric acid and optionally additives of other mineral acids.

The disadvantages of the etching methods described are due to the time-consuming, material-intensive and expensive process steps, which are in some cases very complex in technological and safety terms and, in addition, are frequently carried out discontinuously.

International Application WO 01/83391 A describes etching media in the form of printable, homogeneous, particle-free etching pastes having non-Newtonian flow behaviour for the etching of inorganic, glass-like amorphous or crystalline surfaces, in particular of glasses or ceramics, preferably $SiO_2$— or silicon nitride-based systems, and the use of these etching media. In particular on printing of surfaces, use of these particle-free media gives rise to problems due to inadequate resilience of the printed lines, dots or structures (inadequate structure fidelity), meaning that a significant broadening of the originally printed lines occurs (running of the etching species on the substrate).

U.S. Pat. No. 5,688,366 A uses particle-containing etching pastes for etching a transparent conductive layer, such as, for example, an ITO layer. The etching pastes used are prepared from molten iron chloride containing water of crystallisation, glycerol and polymer particles. These compositions are suitable for etching lines having a width of about 1 mm. Experiments have shown that these etching pastes are not suitable for etching very thin lines having a width of less than 1 mm cleanly and without flaws, irrespective of whether polymer particles having a diameter of 0.01 µm or of 30 µm are employed for the preparation of the pastes.

Objective

The object of the present invention is therefore to provide novel, inexpensive etching pastes for etching very uniform, thin lines having a width of less than 100 µm, in particular less than 80 µm, and extremely fine structures on silicon dioxide and/or silicon nitride layers, in particular also in conductive layers, which are located on silicon solar cells. A further object of the present invention is to provide novel etching media which can be removed from the treated surfaces after the etching in a simple manner without leaving residues and have more environmentally friendly properties than known pastes.

BRIEF DESCRIPTION OF THE INVENTION

The object is achieved by a novel printable, dispensable etching medium for etching oxidic transparent and conductive surfaces and layers in the form of an etching paste comprising
a) phosphoric acid,
b) at least one solvent,
c) graphite and/or carbon black having a relative particle diameter in the range from 80 nm to 20 nm and a specific BET surface area in the range from 40 to 100 $m^2/g$,
d) optionally thickeners, and
e) optionally additives, such as antifoams, thixotropic agents, flow-control agents, deaerators and adhesion promoters.

In a particular embodiment, etching media of this type comprise graphite or carbon-black powder having relative particle diameters of less than 50 nm and a specific BET surface area in the range from 50 to 70 $m^2/g$. It has proven particularly advantageous for the graphite or carbon-black powder present to have relative particle diameters in the range from 30 nm to 45 nm. Etching media comprising carbon-black powder having a relative particle diameter of 40 nm and a specific BET surface area of 62 $m^2/g$ have very particularly good properties. While higher proportions of solids were necessary in earlier compositions, the addition of less than 8% by weight, but more than 0.5% by weight, of graphite or carbon-black powder having the said properties gives, in accordance with the invention, compositions which can be printed in the form of extremely fine lines. Compositions which have a graphite or carbon-black powder content in the range from 3 to 7% by weight and a viscosity in the range from 25 to 35 Pas have particularly good properties. Corresponding compositions can advantageously be used for etching ITO layers at temperatures between 120-170° C.

DESCRIPTION OF THE INVENTION

The novel paste formulations have significantly improved properties with respect to surface cleaning, print precision and waste-water pollution after the etching operation. Surprisingly, it has been found that the etching pastes to which extremely fine-particulate inorganic powders, in particular fine-particulate graphite and/or carbon black, have been added have improved cleaning properties if they are employed for etching ITO at temperatures between 120-170° C., compared with pastes to which commercially available graphite or carbon black has been added. The subsequent cleaning of the treated surfaces is carried out with deionised water.

An essential advantage of the novel paste formulations according to the invention furthermore consists in that the inorganic powders present remain unchanged and do not melt at the etching temperatures, but contribute to the fact that the etching paste can be applied to the surfaces in extremely thin lines or extremely fine structures without running and bleeding and are able subsequently to diffuse to the site of action during the etching operation. In particular, the use of inorganic graphite or carbon-black powder having relative particle diameters of less than 80 nm, in particular less than 50 nm, preferably 45 nm to 30 nm, and a specific BET surface area in the range from 40 to 100 $m^2/g$, preferably from 50 to 70 $m^2/g$, gives improved results. The use of carbon-black powders having particle diameters of about 40 nm and a specific BET surface area of about 62 $m^2/g$ is very particularly preferred. The use of these carbon-black powders gives particularly good etching results. Compared with the use of polymer powders, whose smallest particle sizes are 3-5 µm, significantly finer lines and smaller structures can be printed and etched due to the addition of nanoparticulate carbon-black particles, i.e. significantly improved printing precision is achieved, and significantly smaller structures can be printed and etched on ITO. Consequently, novel potential applications in simple displays and also in high-resolution TFT displays arise, as shown by FIGS. 1 to 3.

The pastes according to the invention are prepared using commercially available graphite or carbon-black powders which have the properties described above and meet the size and surface requirements. Mention may be made here by way of example of the commercial product Super P™ (conductive carbon black from TIMCAL Graphite & Carbon, Switzerland). The particle sizes can generally be determined using conventional methods. For example, the particle size can be determined by means of particle correlation spectroscopy (PCS), with the investigation being carried out using a Malvern Zetasizer in accordance with the instruction manual. The diameter of the particles is determined here as the $d_{50}$ or $d_{90}$ value. The particle diameters indicated are preferably quoted as do values.

The particle diameters can generally be determined by means of laser diffraction combined with on-line analysis. To this end, a laser beam is shone into a particle cloud distributed in a transparent gas, for example air. The particles refract the light, with small particles refracting the light at a greater angle than large particles. The scatter angle is thus directly correlated to the particle size. The observed scatter angle increases logarithmically with decreasing particle size. The refracted light is measured by a number of photodetectors arranged at various angles. The measurements are preferably evaluated using Mie light diffraction theory, which is based on Maxwell's electromagnetic field equation. This theory is based on two assumptions. Firstly, it is assumed that the particles to be measured are spherical, but this only really applies to few particles. The measured laser diffraction is used to calculate the volume of particles. Secondly, dilute particle suspensions are assumed. The method usually used to determine particle sizes in the nano range by dynamic light scattering is described in greater detail in the brochure "Dynamic Light Scattering: An Introduction in 30 Minutes", DLS technical note, MRK656-01 from Malvern Instruments Ltd.

The particle size in the nanoparticulate range can also be determined with the aid of scanning electron photomicrographs (SEM photographs). To this end, particle-containing emulsions can be prepared and applied to a suitable surface in an extremely thin layer in a spin-coating process. After evaporation of the solvent, SEM photographs are taken and the particle diameters recorded are measured. The relative particle diameter of the measured sample is determined by statistical evaluation. Standardised methods for determining particle sizes and devices suitable for this purpose are described in ISO 13321, Methods for Determination of Particle Size Distribution Part 8: Photon Correlation Spectroscopy, International Organisation for Standardisation [(ISO) 1996 (First Edition 1996-07-01)], including methods for determining sizes in the nm measurement range.

It has proven particularly advantageous that the use in accordance with the invention of nanoparticulate carbon black enables the addition of solids to the etching paste compositions to be significantly reduced. Surprisingly, it has been found that the percentage of solid in the etching paste can be reduced by more than 70% by weight if nanoparticulate carbon-black powder is employed compared with the use of polymer particles in pastes of comparable viscosity. This applies, in particular, to the use of graphite and/or carbon black having relative particle diameters in the range from 20 nm to 80 nm and a specific BET surface area in the range from 40 to 100 $m^2/g$.

In particular if carbon-black particles having relative particle diameters of about 40 nm and a specific BET surface area of about 62 $m^2/g$ are used as solid in a corresponding composition, the addition of solids can be reduced by about 74% compared with the addition of polymer particles having a relative particle diameter in the range 3-5 μm in order to prepare a paste having a viscosity of less than 40 Pas, in particular about 30 Pas. In this way, a significantly more environmentally friendly paste can be prepared. This also enables the service life of the waste-water filters necessary for the removal of suspended particles from the waste water to be considerably extended, more precisely for the removal of the suspended particles from the waste water produced in the rinsing operations for cleaning the etched surfaces.

Surprisingly, measurements have shown that the rinsed-off carbon-black particles (active carbon) have an adsorptive action for the organic thickener additives and organic solvent components of the paste. This has the consequence that the BOD5 value (mg/l) in the rinse water can be reduced by simple particle filtration. The BOD5 value is the biological oxygen demand (mg/l) of waste water in 5 days, measured in accordance with DIN 38409 H51. Whereas a BOD5 value of 14 mg/l is determined, for example, on use of an etching paste comprising polymer particles with otherwise identical composition, a BOD5 value of only 7-8 mg/l arises for pastes comprising carbon-black particles added in accordance with the invention for the same amount of paste in the rinse water in each case (135 mg of paste/0.5 l of rinse water).

An effective etching component which has proven particularly effective is, in particular, phosphoric acid, more precisely in concentrations in the range from about 35 to 50% by weight. Compositions having a phosphoric acid concentration in the range from 40 to 50% by weight have proven particularly effective. They have very particularly advantageous properties since they can be printed well onto the surfaces and give very good etching results. Particular preference is given to etching pastes having a phosphoric acid content of 45 to 46% by weight.

In order to prepare the etching pastes, the various components are mixed with one another successively with adequate mixing in such a way that the temperature is only able to increase moderately during the addition of etching component, but a paste having a suitable viscosity forms during the mixing.

As already indicated above, etching pastes can be printed in particularly fine lines and structures if graphite and/or carbon black having a relative particle diameter in the range from 20 nm to 80 nm and a specific BET surface area in the range from 40 to 100 $m^2/g$ are present therein. The surface nature of the particles here is not only of importance for the properties as etching paste, but also, as described above, considerably influences the environmental acceptability of the pastes.

For the preparation of the pastes according to the invention, graphite and/or carbon black having a relative particle diameter of less than 50 nm and a specific BET surface area in the range 50 to 70 $m^2/g$ are therefore preferably used. Particular preference is given to powders having relative particle diameters in the range from 30 nm to 45 nm and very particularly preferably carbon-black powders having a relative particle diameter of 40 nm and a specific BET surface area of 62 $m^2/g$, since these compositions result in particularly low BOD5 values. In order to result in the advantageous paste properties, the solids particles in the form of graphite and/or carbon black must be present in the compositions in amounts of less than 8% by weight. 3 to 7% by weight of the nanoparticulate graphite or carbon-black powder are preferably added to the pastes. In particular, the addition of about 5 to 6% by weight gives etching pastes having a viscosity in the range from 25 to 35 Pas, which can be printed extremely well, as shown very clearly by the etch pictures in FIG. 1 to 3. However, addition of less nanoparticulate carbon black or graphite in an amount of 0.5% by weight also already results in improved behaviour during printing compared with the use of pastes in which polymer particles are present in the same amount. Even these small amounts of particles enable printing with a reduced line width.

Besides the nanoparticulate graphite or carbon black, the pastes may comprise thickeners and optionally additives, such as antifoams, thixotropic agents, flow-control agents, deaerators and adhesion promoters. Solvents which may be incorporated are water and/or organic solvents. Thus, the pastes according to the invention may comprise water, polyvinylpyrrolidone and 1-methylpyrrolidone besides the basic constituents of phosphoric acid and carbon-black or graphite powder. Whereas 1-methylpyrrolidone may be present in the same amounts as phosphoric acid, polyvinylpyrrolidone is usually present in an amount of less than 10% by weight, preferably in an amount of about 5 to 6% by weight.

Additives having advantageous properties for the desired purpose are antifoams, such as, for example, those available under the trade name TEGO® Foamex N,
thixotropic agents, such as BYK® 410, Borchigel® Thixo2,
flow-control agents, such as TEGO® Glide ZG 400,
deaerators, such as TEGO® Airex 985, and
adhesion promoters, such as Bayowet® FT 929.

It goes without saying per se to the person skilled in the art that these additives may also be replaced by other commercially available products with the same action. It is essential in this connection that the addition of such additives improves the product properties.

Additives employed specifically in experiments carried out are also revealed in the examples given below.

These may have a positive influence on the printability of the etching paste. The proportion of the additives is in the range 0-5% by weight, based on the total weight of the etching paste.

The etching pastes according to the invention can be printed on the wafer surfaces in a known manner. In particular, they are applied in fine line printing <50 μm. This is possible, for example, on use of a screen having the following parameters:

| Mesh count: | steel fabric | 350 mesh/inch |
|---|---|---|
| Filament diameter: | 16 μm | |
| Emulsion thickness: | 10 μm | |
| Screen separation during printing: | 75 μm | |

FIGS. 1 to 3 show etching results for the production of which lines of different thickness have been printed. In addition, it can be seen from these figures that lines at a separation of less than 100 μm can be etched using the pastes according to the invention without having to use photoresist layers. It is therefore possible to produce high-resolution etched structures in a simple manner using the etching pastes according to the invention.

Figure 1:
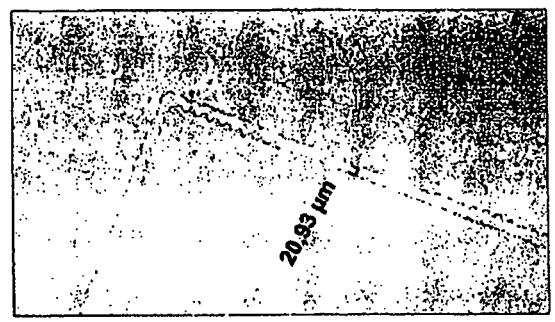
FIG. 1 shows an etched line having a width of 20.93 μm which has been etched into an ITO layer.
Figure 2:
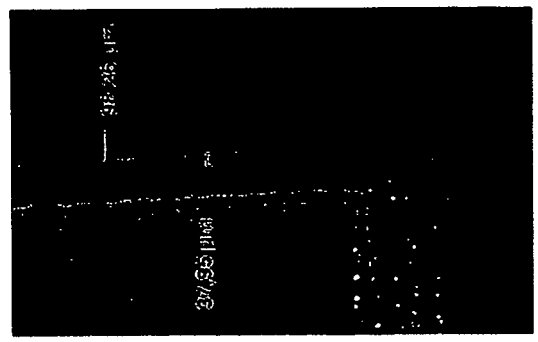
FIG. 2 shows three etched lines having a width of 37.95 μm alongside one another, in each case at a separation of 98.26 μm.
Figure 3:
FIG. 3 shows the continuous structure of an etched line having a width of 38.4 μm.

It can be seen from the etch pictures shown that the etching pastes according to the invention are suitable for continuously etching even extremely thin lines without termination of the lines occurring in the course of the etched tracks.

EXAMPLES

For better understanding and in order to illustrate the invention, examples are given below which are within the scope of protection of the present invention. These examples also serve to illustrate possible variants. Owing to the general validity of the inventive principle described, however, the examples are not suitable for reducing the scope of protection of the present application to these alone.

It goes without saying per se to the person skilled in the art that, both in the examples given and also in the remainder of the description, the component amounts present in the paste compositions always add up in total only to 100% and cannot be greater even if higher values could arise from the per cent ranges indicated.

Example 1

Etching paste comprising an inorganic nanoparticulate solid additive
218 g of deionised water
223 g of 1-methyl-2-pyrrolidone
1.6 g of ethylene glycol
The following are added successively with stirring to this solvent mixture:
465 g of phosphoric acid (85%)
and
11 g of polyvinylpyrrolidone,
where polyvinylpyrrolidone is incorporated with vigorous stirring.
50 g of carbon black
are then added to the clear homogeneous mixture, which is stirred for a further 2 hours.

The ready-to-use paste can be printed using a 280 mesh stainless-steel fabric screen. In principle, polyesters or similar screen materials can also be used. The crucial factor is that the screen material selected is inert to the etching component present in the etching composition.

The etching paste prepared has proven to be stable on storage over a long period with retention of the advantageous etching properties. Further examples of compositions according to the invention having advantageous properties are given in the following tables:

| Batch | Triethylene glycol monomethyl ether [g] | H₂O [g] | Stabileze QM [g] | Polyethylene glycol [g] | Natrosol GR250 [g] | Lactic acid (90%) [g] | H₃PO₄ (85%) [g] | 1-Methyl-2-pyrrolidone [g] | Carbon black [g] | Graphite [g] | Ethylene glycol [g] | PVP [g] |
|---|---|---|---|---|---|---|---|---|---|---|---|---|
| 1 | 0 | 218 | 8 | 4 | 8 | 0 | 465 | 223 | 19 | 0 | 1.6 | 0 |
| 2 | 0 | 219 | 7.7 | 4 | 8.5 | 0 | 463 | 223 | 17 | 0 | 2 | 0 |
| 3 | 0 | 220 | 7.4 | 8 | 9 | 0 | 461 | 223 | 15 | 0 | 2.4 | 0 |
| 4 | 0 | 221 | 7.1 | 8 | 9.5 | 0 | 459 | 223 | 13 | 0 | 2.8 | 0 |
| 5 | 0 | 222 | 6.8 | 0 | 10 | 0 | 457 | 223 | 11 | 0 | 3.2 | 0 |
| 6 | 0 | 223 | 6.5 | 0 | 10.5 | 0 | 455 | 223 | 9 | 0 | 3.6 | 0 |
| 7 | 0 | 224 | 6.2 | 0 | 11 | 0 | 453 | 223 | 7 | 0 | 3 | 0 |
| 8 | 0 | 225 | 5.9 | 0 | 11.5 | 0 | 451 | 223 | 8 | 0 | 2.4 | 0 |
| 9 | 0 | 226 | 5.6 | 0 | 12 | 0 | 449 | 223 | 9 | 0 | 1.8 | 0 |
| 10 | 0 | 227 | 5.3 | 0 | 12.5 | 0 | 447 | 223 | 10 | 0 | 1.2 | 0 |
| 11 | 0 | 228 | 5 | 0 | 13 | 0 | 445 | 223 | 11 | 0 | 0.6 | 0 |
| 12 | 0 | 229 | 4.7 | 0 | 13.5 | 0 | 443 | 223 | 12 | 0 | 0 | 0 |
| 13 | 0 | 0 | 0 | 0 | 0 | 0 | 450 | 466 | 13 | 0 | 0 | 60 |
| 14 | 0 | 0 | 0 | 0 | 0 | 0 | 452 | 464 | 19 | 0 | 0 | 59.5 |
| 15 | 0 | 0 | 0 | 0 | 0 | 0 | 454 | 462 | 25 | 0 | 0 | 59 |

-continued

| Batch | Triethylene glycol monomethyl ether [g] | H₂O [g] | Stabileze QM [g] | Polyethylene glycol [g] | Natrosol GR250 [g] | Lactic acid (90%) [g] | H₃PO₄ (85%) [g] | 1-Methyl-2-pyrrolidone [g] | Carbon black [g] | Graphite [g] | Ethylene glycol [g] | PVP [g] |
|---|---|---|---|---|---|---|---|---|---|---|---|---|
| 16 | 0 | 0 | 0 | 0 | 0 | 0 | 456 | 460 | 31 | 0 | 0 | 58.5 |
| 17 | 0 | 0 | 0 | 0 | 0 | 0 | 458 | 458 | 37 | 0 | 0 | 58 |
| 18 | 0 | 0 | 0 | 0 | 0 | 0 | 460 | 456 | 43 | 0 | 0 | 57.5 |
| 19 | 0 | 0 | 0 | 0 | 0 | 0 | 462 | 454 | 49 | 0 | 0 | 57 |
| 20 | 0 | 0 | 0 | 0 | 0 | 0 | 464 | 452 | 55 | 0 | 0 | 56.5 |
| 21 | 0 | 0 | 0 | 0 | 0 | 0 | 450 | 466 | 61 | 0 | 0 | 60 |
| 22 | 0 | 0 | 0 | 0 | 0 | 0 | 452 | 464 | 67 | 0 | 0 | 59.5 |
| 23 | 0 | 0 | 0 | 0 | 0 | 0 | 454 | 462 | 73 | 0 | 0 | 59 |
| 24 | 0 | 0 | 0 | 0 | 0 | 0 | 456 | 460 | 79 | 0 | 0 | 58.5 |
| 25 | 0 | 0 | 0 | 0 | 0 | 0 | 458 | 458 | 85 | 0 | 0 | 25 |
| 26 | 0 | 0 | 0 | 0 | 0 | 0 | 460 | 456 | 68 | 0 | 0 | 30 |
| 27 | 0 | 0 | 0 | 0 | 0 | 0 | 462 | 454 | 51 | 0 | 0 | 35 |
| 28 | 0 | 0 | 0 | 0 | 0 | 5 | 464 | 452 | 50 | 0 | 0 | 56.5 |
| 29 | 1 | 0 | 0 | 0 | 0 | 5 | 466 | 450 | 49 | 0 | 0 | 56 |
| 30 | 2 | 0 | 0 | 0 | 0 | 5 | 468 | 448 | 48 | 0 | 0 | 55.5 |
| 31 | 2 | 0 | 0 | 0 | 0 | 0 | 470 | 446 | 47 | 0 | 0 | 55 |
| 32 | 0 | 218 | 8 | 4 | 8 | 0 | 465 | 223 | 0 | 19 | 1.6 | 0 |
| 33 | 0 | 219 | 7.7 | 4 | 8.5 | 0 | 463 | 223 | 0 | 17 | 2 | 0 |
| 34 | 0 | 220 | 7.4 | 8 | 9 | 0 | 461 | 223 | 0 | 15 | 2.4 | 0 |
| 35 | 0 | 221 | 7.1 | 8 | 9.5 | 0 | 459 | 223 | 0 | 13 | 2.8 | 0 |
| 36 | 0 | 222 | 6.8 | 0 | 10 | 0 | 457 | 223 | 0 | 11 | 3.2 | 0 |
| 37 | 0 | 223 | 6.5 | 0 | 10.5 | 0 | 455 | 223 | 0 | 9 | 3.6 | 0 |
| 38 | 0 | 224 | 6.2 | 0 | 11 | 0 | 453 | 223 | 0 | 7 | 3 | 0 |
| 39 | 0 | 225 | 5.9 | 0 | 11.5 | 0 | 451 | 223 | 0 | 8 | 2.4 | 0 |
| 40 | 0 | 226 | 5.6 | 0 | 12 | 0 | 449 | 223 | 0 | 9 | 1.8 | 0 |
| 41 | 0 | 227 | 5.3 | 0 | 12.5 | 0 | 447 | 223 | 0 | 10 | 1.2 | 0 |
| 42 | 0 | 228 | 5 | 0 | 13 | 0 | 445 | 223 | 0 | 11 | 0.6 | 0 |
| 43 | 0 | 229 | 4.7 | 0 | 13.5 | 0 | 443 | 223 | 0 | 12 | 0 | 0 |
| 44 | 0 | 0 | 0 | 0 | 0 | 0 | 450 | 466 | 0 | 13 | 0 | 60 |
| 45 | 0 | 0 | 0 | 0 | 0 | 0 | 452 | 464 | 0 | 19 | 0 | 59.5 |
| 46 | 0 | 0 | 0 | 0 | 0 | 0 | 454 | 462 | 0 | 25 | 0 | 59 |
| 47 | 0 | 0 | 0 | 0 | 0 | 0 | 456 | 460 | 0 | 31 | 0 | 58.5 |
| 48 | 0 | 0 | 0 | 0 | 0 | 0 | 458 | 458 | 0 | 37 | 0 | 58 |
| 49 | 0 | 0 | 0 | 0 | 0 | 0 | 460 | 456 | 0 | 43 | 0 | 57.5 |
| 50 | 0 | 0 | 0 | 0 | 0 | 0 | 462 | 454 | 0 | 49 | 0 | 57 |
| 51 | 0 | 0 | 0 | 0 | 0 | 0 | 464 | 452 | 0 | 55 | 0 | 56.5 |
| 52 | 0 | 0 | 0 | 0 | 0 | 0 | 450 | 466 | 0 | 61 | 0 | 60 |
| 53 | 0 | 0 | 0 | 0 | 0 | 0 | 452 | 464 | 0 | 67 | 0 | 59.5 |
| 54 | 0 | 0 | 0 | 0 | 0 | 0 | 454 | 462 | 0 | 73 | 0 | 59 |
| 55 | 0 | 0 | 0 | 0 | 0 | 0 | 456 | 460 | 0 | 79 | 0 | 58.5 |
| 56 | 0 | 0 | 0 | 0 | 0 | 0 | 458 | 458 | 0 | 85 | 0 | 58 |
| 57 | 0 | 0 | 0 | 0 | 0 | 0 | 460 | 456 | 0 | 68 | 0 | 57.5 |
| 58 | 0 | 0 | 0 | 0 | 0 | 0 | 462 | 454 | 0 | 51 | 0 | 57 |
| 59 | 0 | 0 | 0 | 0 | 0 | 5 | 464 | 452 | 0 | 50 | 0 | 56.5 |
| 60 | 1 | 0 | 0 | 0 | 0 | 5 | 466 | 450 | 0 | 49 | 0 | 56 |
| 61 | 2 | 0 | 0 | 0 | 0 | 5 | 468 | 448 | 0 | 48 | 0 | 55.5 |
| 62 | 2 | 0 | 0 | 0 | 0 | 0 | 470 | 446 | 0 | 47 | 0 | 55 |

The invention claimed is:

1. A Printable dispensable etching medium for etching oxidic transparent and conductive surfaces and layers, wherein said printable dispensable etching medium is in the form of an etching paste comprising
   a) 35 to 50% by weight of phosphoric acid,
   b) at least one solvent,
   c) graphite and/or carbon black having a relative particle diameter in the range from 20 nm to 80 nm and a specific BET surface area in the range from 40 to 100 m²/g and in an amount of 3-7% by weight,
   d) optionally thickeners, and
   e) optionally additives, such as antifoams, thixotropic agents, flow-control agents, deaerators and adhesion promoters.

2. An etching medium according to claim 1, comprising graphite or carbon-black powder having a relative particle diameter of 20 nm to 50 nm and a specific BET surface area in the range 50 to 70 m²/g.

3. An etching medium according to claim 1, comprising graphite or carbon-black powder having a relative particle diameter in the range from 30 nm to 45 nm.

4. An etching medium according to claim 1, comprising carbon-black powder having a relative particle diameter of 40 nm and a specific BET surface area of 62 m²/g.

5. An etching medium according to claim 1, comprising carbon-black powder in an amount of 3-7% by weight.

6. An etching medium according to claim 1, comprising graphite or carbon-black powder in an amount of 3 to 7% by weight and a viscosity in the range from 25 to 35 Pa·s.

7. A Printable dispensable etching medium according to claim 1, comprising 40-50% by weight phosphoric acid.

8. A Printable dispensable etching medium according to claim 7, comprising 45-46% by weight phosphoric acid.

9. A Printable dispensable etching medium according to claim 1, comprising:
   40-50% by weight phosphoric acid,
   water,
   3-7% by weight graphite and/or carbon black,
   and
   polyvinylpyrolidone.

10. A printable dispensable etching medium according to claim 9, comprising 5 to 6% by weight of polyvinylpyrrolidone.

11. A method for etching transparent, conductive oxidic layers during semiconductor manufacture comprising etching with an etching medium according to claim 1.

12. A method for etching ITO at temperatures between 120-170° C. comprising etching with an etching medium according to claim 1.

13. A process for etching oxidic transparent and conductive surfaces and layers comprising dispensing an etching paste onto said oxidic transparent and conductive surfaces and layers, wherein said etching paste comprises:
 a) 35 to 50% by weight of phosphoric acid,
 b) at least one solvent
 c) graphite and/or carbon black having a relative particle diameter in the range from 20 nm to 80 nm and a specific BET surface area in the range from 40 to 100 m2/g and in an amount of 3-7% by weight,
 d) optionally thickeners, and
 e) optionally additives, such as antifoams, thixotropic agents, flow-control agents, deaerators and adhesion promoters.

14. A process according to claim 13, said etching paste comprising graphite or carbon-black powder having a relative particle diameter of 20 nm to 50 nm and a specific BET surface area in the range 50 to 70 $m^2/g$.

15. A process according to claim 13, said etching paste comprising graphite or carbon-black powder having a relative particle diameter in the range from 30 nm to 45 nm.

16. A process according to claim 13, said etching paste comprising carbon-black powder having a relative particle diameter of 40 nm and a specific BET surface area of 62 $m^2/g$.

17. A process according to claim 13, said etching paste comprising graphite or carbon-black powder in an amount of 3 to 7% by weight and a viscosity in the range from 25 to 35 Pa·s.

18. A combination comprising:
A) a printable dispensable etching paste for etching lines on oxidic transparent and conductive surfaces and layers, said etching paste having a viscosity in the range from 25 to 35 Pa·s and comprising
 a) 35-50% by weight phosphoric acid,
 b) at least one solvent,
 c) 3-7% by weight of graphite and/or carbon black having a relative particle diameter in the range from 20 nm to 80 nm and a specific BET surface area in the range from 40 to 100 m2/g,
 d) optionally thickeners, and
 e) optionally additives, such as antifoams, thixotropic agents, flow-control agents, deaerators and adhesion promoters
and
B) an oxidic transparent and conductive surface.

19. A printable dispensable etching medium for etching oxidic transparent and conductive surfaces and layers, wherein said printable dispensable etching medium is in the form of an etching paste comprising
 a) 35 to 50% by weight of phosphoric acid,
 b) at least one solvent,
 c) graphite and/or carbon black having a relative particle diameter in the range from 20 nm to 80 nm and a specific BET surface area in the range from 40 to 100 $m^2/g$ and in an amount of less than 8% by weight, but more than 0.5% by weight,
 d) 1-methylpyrrolidone, and
 e) optionally additives, such as antifoams, thixotropic agents, flow-control agents, deaerators and adhesion promoters
wherein said paste has a viscosity of less than 40 Pas.

* * * * *